(12) United States Patent
Tanaka et al.

(10) Patent No.: US 8,852,734 B2
(45) Date of Patent: Oct. 7, 2014

(54) EPOXY RESIN COMPOSITION, PREPREG, METAL-CLAD LAMINATE, PRINTED WIRING BOARD AND SEMICONDUCTOR DEVICE

(75) Inventors: Nobuki Tanaka, Tokyo (JP); Seiji Mori, Tokyo (JP)

(73) Assignee: Sumitomo Bakelite Company, Ltd., Tokyo (JP)

( * ) Notice: Subject to any disclaimer, the term of this patent is extended or adjusted under 35 U.S.C. 154(b) by 462 days.

(21) Appl. No.: 12/902,505

(22) Filed: Oct. 12, 2010

(65) Prior Publication Data

US 2011/0083890 A1  Apr. 14, 2011

(30) Foreign Application Priority Data

Oct. 14, 2009 (JP) ................ 2009-237244
Mar. 5, 2010 (JP) ................ 2010-049109

(51) Int. Cl.

| H05K 1/03 | (2006.01) |
|---|---|
| B32B 15/092 | (2006.01) |
| B32B 27/04 | (2006.01) |
| B32B 27/20 | (2006.01) |
| B32B 27/38 | (2006.01) |
| C08K 3/36 | (2006.01) |
| C08G 59/32 | (2006.01) |
| C08L 63/00 | (2006.01) |
| C08L 63/04 | (2006.01) |
| C08G 59/40 | (2006.01) |
| C08G 59/62 | (2006.01) |
| C08J 5/24 | (2006.01) |

(52) U.S. Cl.
CPC ........... *H05K 1/0373* (2013.01); *C08J 2363/00* (2013.01); *C08G 59/4014* (2013.01); *H05K 2201/0257* (2013.01); *C08K 2201/011* (2013.01); *C08G 59/621* (2013.01); *C08K 2201/003* (2013.01); *C08K 3/36* (2013.01); *C08L 63/00* (2013.01); *H05K 2201/0209* (2013.01); *C08J 5/24* (2013.01); *H05K 2201/0266* (2013.01); *Y10S 428/901* (2013.01)
USPC ............. 428/301.1; 428/297.4; 428/301.4; 428/414; 428/416; 428/901; 523/443; 525/523; 525/528

(58) Field of Classification Search
CPC ....... C08L 63/00; C08L 63/04; C09D 163/00; C09D 163/04; C09J 163/00; C09J 163/04; C08G 59/20; C08G 59/32; C08G 59/3218; C08G 59/621; C08K 3/36; C08K 5/315; C08K 5/3415; C08J 5/24; H05K 1/0313; H05K 1/0353; H05K 1/0366; H05K 1/0373; H05K 1/18; B32B 15/092; B32B 27/04; B32B 27/20; B32B 27/38
USPC ................. 523/443, 466; 525/523, 528, 529; 428/297.4, 301.1, 301.4, 413, 416, 428/418, 901
See application file for complete search history.

(56) References Cited

U.S. PATENT DOCUMENTS

| 5,049,596 A | * | 9/1991 | Fujimoto et al. ............... 523/427 |
| 6,054,222 A | * | 4/2000 | Takami et al. ................. 428/417 |
| 2009/0110938 A1 | | 4/2009 | Nishimura et al. |
| 2010/0044090 A1 | | 2/2010 | Endo |

FOREIGN PATENT DOCUMENTS

| CN | 101423668 | | 5/2009 | |
| JP | 63-268745 | | 11/1988 | |
| JP | 05170876 A | * | 7/1993 | .............. C08G 59/40 |
| JP | 09324108 A | * | 12/1997 | .............. C08L 63/00 |
| JP | 2001172473 A | * | 6/2001 | .............. C08L 63/00 |
| JP | 2006-036916 | | 2/2006 | |
| WO | WO 2008/126825 | | 10/2008 | |

OTHER PUBLICATIONS

Machine translation of JP 09324108 A, provided by the JPO website (no date).*
Machine translation of JP 2001172473 A, provided by the JPO website (no date).*
Machine translation of JP 05170876 A, provided by the JPO website (no date).*
Chinese Office Action for corresponding CN Application No. 201010510338.3, Dec. 3, 2013.

* cited by examiner

*Primary Examiner* — Michael J Feely
(74) *Attorney, Agent, or Firm* — Ditthavong & Steiner, P.C.

(57) ABSTRACT

The present invention is to provide an epoxy resin composition uniformly containing a large amount of inorganic fillers, excellent in heat resistance and flame resistance, and having good impregnation into a base material, and a prepreg using the epoxy resin composition, having good tackiness, and being easy in handling. Furthermore, it is to provide a printed wiring board using a metal-clad laminate formed using the prepreg and/or the prepreg or the epoxy resin composition, capable of easily conducting an ENEPIG process, and a semiconductor device using the printed wiring board, excellent in performances. An epoxy resin composition comprises a solid epoxy resin, a silica nanoparticle having an average particle diameter of 1 nm or more and 100 nm or less, and a silica particle having an average particle diameter larger than that of the silica nanoparticle, in the range of 0.1 μm or more and 5.0 μm or less.

12 Claims, 6 Drawing Sheets

EPOXY RESIN COMPOSITION, PREPREG, METAL-CLAD LAMINATE, PRINTED WIRING BOARD AND SEMICONDUCTOR DEVICE

TECHNICAL FIELD

The present invention relates to an epoxy resin composition, a prepreg, a metal-clad laminate, a printed wiring board and a semiconductor device.

BACKGROUND ART

In recent years, with growing demand of higher function of electronics, high-density integration within electronic components and high-density mounting of electronic components have been developed. Hence, printed wiring boards capable of high-density mounting and so on used for the electronic components have been developed in miniaturization, high density and multilayering than ever before. Hence, a printed wiring board excellent in low-thermal expansion property, and having small warpage upon connecting parts by reflow is required in order to solve the problem of decrease in rigidity of the substrate itself due to thinner design, a printed wiring board excellent in heat resistance is required to solve the problem of increase in amount of heat generation of printed wiring board due to density growth, a printed wiring board excellent in desmearing property upon plating process, and capable of sufficiently ensuring electrical conductivity between an upper layer metal wiring and a lower layer metal wiring is required as printed wiring boards are multilayering, and further a printed wiring board having a simple production process is required to realize fast mass production.

A prepreg used for production of a printed wiring board is generally produced by dissolving a resin composition comprising a thermosetting resin such as an epoxy resin as a main component in a solvent to prepare a resin varnish, and impregnating a base material with the resin varnish followed by drying by heat. In order to improve the heat resistance, low-thermal expansion property, flame resistance, etc. of the printed wiring board, a prepreg using a resin varnish containing an inorganic filler is produced.

However, since the viscosity of the resin varnish containing the inorganic filler in a large amount is high, sufficient impregnation of the resin composition into a base material and uniform impregnation of the inorganic filler have been difficult. The viscosity of the resin varnish containing a large amount of inorganic filler may be decreased by using a liquid epoxy resin as the main component of the resin composition, however, a prepreg prepared by using the resin varnish has a problem that after removing the solvent by drying, the prepreg has high tackiness, and stickiness, and its handling is difficult.

Japanese Patent Application Laid-Open (JP-A) No. 2006-36916 discloses that a slurry composition, in which a spherical silica particle having an average particle diameter of 0.1 µm or more and 5 µm or less and a silica nanoparticle having an average particle diameter of 1 nm or more and 50 nm or less are dispersed in an organic solvent, has silica fillers in a closest packing state due to the difference of particle diameter between the spherical silica particle and the silica nanoparticle, and a varnish composition prepared by compounding an epoxy resin in the slurry composition contains the silica fillers uniformly and in high compounding amount. Furthermore, an insulation film and prepreg produced using the varnish composition are disclosed. However, the epoxy resin used in Examples of JP-A No. 2006-36916 is merely a liquid epoxy resin in a solventless state.

SUMMARY OF INVENTION

Technical Problem

A first object of the present invention is to provide an epoxy resin composition uniformly containing inorganic fillers in a large amount, excellent in heat resistance and flame resistance, and having a good impregnation into a base material.

A second object of the present invention is to provide a prepreg using the epoxy resin composition, excellent in heat resistance and flame resistance, having good tackiness, and being easy in handling.

A third object of the present invention is to provide a metal-clad laminate formed using the prepreg, and to provide a printed wiring board using the metal-clad laminate and/or the prepreg or the epoxy resin composition, excellent in heat resistance and flame resistance, and capable of preventing conduction failure in a plating step upon conducting a plating process by an ENEPIG method (Electroless Nickel Electroless Palladium Immersion Gold) without surface treatment.

A forth object of the present invention is to provide a semiconductor device formed using the printed wiring board, excellent in performance.

Solution to Problem

The above objects can be attained by the following (1) to (10).

(1) An epoxy resin composition comprising a solid epoxy resin, a silica nanoparticle having an average particle diameter of 1 nm or more and 100 nm or less, and a silica particle having an average particle diameter larger than that of the silica nanoparticle, in the range of 0.1 µm or more and 5.0 µm or less.

(2) The epoxy resin composition according to the above (1), wherein the average particle diameter of the silica nanoparticle is 40 nm or more and 100 nm or less.

(3) The epoxy resin composition according to the above (1), further comprising a cyanate resin.

(4) The epoxy resin composition according to the above (1), further comprising a maleimide resin.

(5) The epoxy resin composition according to the above (1), wherein the solid epoxy resin is at least one kind selected from the group consisting of a biphenylaralkyl type epoxy resin, a naphthalene-skeleton-modified cresol novolac type epoxy resin, and a cresol novolac type epoxy resin.

(6) A prepreg comprising a base material impregnated with the epoxy resin composition defined by the above (1).

(7) A metal-clad laminate comprising a resin-impregnated base layer being a base material impregnated with the epoxy resin composition defined by the above (1), and a metal foil provided on at least one surface of the resin-impregnated base layer.

(8) The metal-clad laminate according to the above (7), wherein the metal-clad laminate is obtained by laminating the metal foil on at least one surface of the prepreg defined by the above (6) or a laminate having two or more prepregs each defined by the above (6) laminated, followed by hot press.

(9) A printed wiring board using the metal-clad laminate defined by the above (7) or (8) for an inner layer circuit board.

(10) A printed wiring board using the prepreg defined by the above (6) to form an insulating layer on an inner layer circuit.

(11) A printed wiring board using the epoxy resin composition defined by the above (1) to form an insulating layer on an inner layer circuit (12) A semiconductor device comprising the printed wiring board defined by any of the above (9) to (11), and a semiconductor element provided on the printed wiring board.

Advantageous Effects of Invention

According to the present invention, since the silica nanoparticle and the silica particle having larger particle diameter than the silica nanoparticle are used as inorganic fillers in the epoxy resin composition, a large amount of inorganic fillers can be contained in the epoxy resin composition, and the heat resistance and flame resistance of the epoxy resin composition can be improved. Furthermore, since the silica nanoparticle and the silica particle have the surface ζ-potential of the same sign and electrically repel each other, the silica nanoparticle and the silica particle uniformly disperse in the epoxy resin composition. Hence, upon production of the prepreg using the epoxy resin composition, a uniform impregnation of a large amount of inorganic fillers into the base material can be realized.

Also, since the epoxy resin composition uses the solid epoxy resin, a prepreg having excellent tackiness after removing the solvent by drying, and thus being easy in handling can be obtained while impregnation of the resin composition into the base material can be sufficiently maintained upon production of the prepreg.

Conduction failure does not occur in the metal-clad laminate formed using the prepreg, and the printed wiring board formed using the metal-clad laminate and/or the prepreg or the epoxy resin composition upon conducting the plating process by the ENEPIG method without surface treatment.

Also, according to the present invention, a semiconductor device excellent in performance can be obtained using the printed wiring board.

BRIEF DESCRIPTION OF DRAWINGS

In the accompanying drawings.

Each of FIGS. 2A to 2C is a schematic view showing an example of a method of producing a metal-clad laminate of the present invention.

Each of FIGS. 3A to 3E is a schematic view showing another example of a method of producing a metal-clad laminate of the present invention.

Each of FIGS. 4A to 4C is a schematic view showing an example of an embodiment in the width direction of a metal foil, an insulating resin layer, and a base material used for producing the metal-clad laminate of the present invention.

REFERENCE SIGNS LIST

1. Base material
2. Impregnation tank
3. Epoxy resin varnish
4. Dip roll
5. Squeeze roll
6. Drier
7. Prepreg
8. Upper roll
10. Metal foil with an insulating resin layer
11. Metal foil
12. Insulating resin layer
20. Base material
30. Polymer film sheet with an insulating resin layer
31. Polymer film sheet
32. Insulating resin layer
40. Prepreg
41. Prepreg with a metal foil
42. Prepreg with a polymer film sheet
51. Metal-clad laminate
52. Metal-clad laminate
61. Metal foil with an insulating resin layer
62. Base material
70a, 70b. Metal foil
70c, 70d, 70e. Metal foil with an insulating resin layer
71. Insulating resin liquid
72. Comma roll
73. Backup roll
74. Hot air drying machine
75. Protecting film
76. Laminate roll
77. Metal foil with an insulating resin layer
80. Vacuum lamination apparatus
81, 81a. Base material
82a, 82b. Joined article
82c. Metal-clad laminate
83. Winding roll
84, 85, 86, 87. Laminate roll
88. Hot air drying machine
89. Pinch roll
90. Metal-clad laminate

DESCRIPTION OF EMBODIMENTS

Hereinafter, an epoxy resin composition, a prepreg, a metal-clad laminate, a printed wiring board and a semiconductor device of the present invention will be described. The content percentage of each component contained in the resin composition is a ratio with respect to the total amount (100 wt %) of all components except a solvent.

The epoxy resin composition of the present invention comprises a solid epoxy resin at ordinary temperature, a silica nanoparticle having an average particle diameter of 1 nm or more and 100 nm or less, and a silica particle having an average particle diameter larger than that of the silica nanoparticle in the range of 0.1 μm or more and 5.0 μm or less.

Also, a prepreg of the present invention comprises a base material impregnated with the above epoxy resin composition.

Also, a metal-clad laminate of the present invention has a metal foil on at least one surface of the above prepreg or a laminate having two or more prepregs of the above laminated.

Also, a printed wiring board of the present invention uses the above metal-clad laminate for an inner layer circuit board Also, a printed wiring board of the present invention uses the above prepreg to form an insulating layer on an inner layer circuit Also, the printed wiring board of the present invention uses the above epoxy resin composition to form an insulating layer on an inner layer circuit Also, a semiconductor device of the present invention comprises the above printed wiring board and a semiconductor element provided on the printed wiring board (Epoxy Resin Composition)

Firstly, the epoxy resin composition of the present invention will be described.

The epoxy resin composition of the present invention contains a solid epoxy resin, and preferably, the composition thereof is also in a solid state. Unlike the case of using a liquid epoxy resin, a prepreg to be obtained has good tackiness and no stickiness, and its handling becomes easy by containing the solid epoxy resin. Conventionally, an epoxy resin composition prepared using a solid epoxy resin is high in viscosity even if the solid epoxy resin is dissolved in a solvent to be used as a varnish, and thus it has been considered to be low in impregnation into a base material. Hence, it has been considered that impregnation of the resin composition into the base material particularly decreases when the resin composition contains a large amount of inorganic fillers. To the contrary, the epoxy resin composition of the present invention contains a large amount of inorganic fillers, and thus often has high or higher viscosity, however, it turns out that the epoxy resin composition of the present invention has sufficient impregnation into the base material by using a micron-size silica particle and a nano-size silica nanoparticle in combination. From the viewpoint of preventing stickiness of the prepreg, it is preferable that the epoxy resin composition containing the solid epoxy resin and also other components is in a solid state in a solventless state.

In the present invention, "solid epoxy resin" or "epoxy resin composition in a solid state" means that an epoxy resin or an epoxy resin composition is in a solid state in a solventless state at ordinary temperature, that is, the epoxy resin or the epoxy resin composition does not have flowability and keeps a certain shape. Also, in the present invention, "ordinary temperature" means temperature generally having in surrounding environment under natural environment, including at least the range from 5 to 35° C.

The solid epoxy resin may be commercially available one. The epoxy resin and epoxy resin composition can be in a solid state by selecting or adjusting conditions such as a Skelton of chemical structure, epoxy equivalent and molecular weight upon synthesizing the epoxy resin and the epoxy resin composition. Generally, an epoxy resin having high molecular weight is in a solid state, however, an epoxy resin having low molecular weight but having a structure having intermolecular interaction such as an aromatic structure, etc. is in a solid state.

The epoxy resin is not particularly limited if it is in a solid state. Examples of the epoxy resin include bisphenol type epoxy resins such as bisphenol A type epoxy resins, bisphenol F type epoxy resins, bisphenol E type epoxy resins, bisphenol S type epoxy resins, bisphenol Z type epoxy resins (4,4'-cyclohexylidenebisphenol type epoxy resins), bisphenol P type epoxy resins (4,4'-(1,4-phenylenediisopropylidiene) bisphenol type epoxy resins), and bisphenol M type epoxy resins (4,4'-(1,3-phenylenediisopropylidiene)bisphenol type epoxy resins); novolac type epoxy resins such as phenol novolac type epoxy resins, and cresol novolac type epoxy resins; arylalkylene type epoxy resins such as biphenyl type epoxy resins, xylylene type epoxy resins, phenolaralkyl type epoxy resins, biphenylaralkyl type epoxy resins, biphenyldimethylene type epoxy resins, trisphenolmethane novolac type epoxy resins, glycidyl ethers of 1,1,2,2-(tetraphenol)ethane, trifunctional or tetrafunctional glycidylamines, and tetramethylbiphenyl type epoxy resins; naphthalene type epoxy resins such as naphthalene-skeleton-modified cresol novolac type epoxy resins, methoxynaphthalene-modified cresol novolac type epoxy resins, and methoxynaphthalene dimethylene type epoxy resins; anthracene type epoxy resins; phenoxy type epoxy resins; dicyclopentadiene type epoxy resins; norbornene type epoxy resins; adamantane type epoxy resins; fluorene type epoxy resins; and flame retardant epoxy resins in which the epoxy resins mentioned above are halogenated. They may be used alone or in combination of two or more kinds having different weight average molecular weight. One or more kinds and prepolymers thereof may also be used in combination.

Among the above epoxy resins, ones having a softening point of 40° C. or more and 150° C. or less are preferable, more preferably 50° C. or more and 100° C. or less. The epoxy resin having a softening point in the above range is excellent in handleability. Further, it is particularly preferable to select at least one kind from the group consisting of biphenylaralkyl type epoxy resins, naphthalene-skeleton-modified cresol novolac type epoxy resins and cresol novolac type epoxy resins. Thereby, the heat resistance and flame resistance can be improved, the tackiness of the prepreg becomes good, and the handling of the prepreg can be easy.

The charging amount of the epoxy resin is not particularly limited, but is preferably 5 weight % or more and 30 weight % or less with respect to the total content of the epoxy resin composition. If the charging amount of the epoxy resin is less than the above lower limit, the curability of the epoxy resin may decrease, and the moisture resistance of the prepreg or printed wiring board obtained by the epoxy resin composition may decrease. If the charging amount of the epoxy resin exceeds the above upper limit, the coefficient of linear thermal expansion of the prepreg or printed wiring board may increase, and the heat resistance may decrease.

The weight-average molecular weight of the epoxy resin is not particularly limited, but is preferably 100 or more and 3,000 or less. If the weight-average molecular weight is less than the above lower limit, the epoxy resin may be in a liquid or semisolid state at room temperature. If the weight-average molecular weight exceeds the above upper limit, the flowability of the epoxy resin composition may decrease, and may not be impregnated into the base material. By having the weight-average molecular weight of the epoxy resin within the above range, it is possible to take an excellent balance of the above properties of the composition.

The weight average molecular weight of the epoxy resin can be measured, for example, by the gel permeation chromatography (GPC), and can be specified in terms of the polystyrene calibrated-weight average molecular weight.

The epoxy resin composition of the present invention comprises the silica nanoparticle having an average particle diameter of 1 nm or more and 100 nm or less, and the silica particle having an average particle diameter larger than that of the silica nanoparticle in the range of 0.1 µm or more and 5.0 µm or less. It is considered that the silica nanoparticle and the silica particle can uniformly disperse in the epoxy resin composition in high concentration since the silica nanoparticle and the silica particle have different particle diameter, and further both have negative surface ζ-potential and thus electrically repel each other.

The average particle diameter of the silica nanoparticle and the silica particle can be measured, for instance, by the laser diffraction and scattering method. The silica nanoparticles (silica particles) are dispersed in water by ultrasonic wave, and then, the particle size distribution of the silica nanoparticles (silica particles) is measured based on volume by means of a laser diffraction particle size analyzer (product name: LA-500; manufactured by HOEIBA). The median diameter is referred to as the average particle diameter. Specifically, the average particle diameter of inorganic fillers such as the silica nanoparticle and the silica particle is defined by D50.

The average particle diameter of the silica nanoparticle is 1 nm or more and 100 nm or less, preferably 40 nm or more and 100 nm or less, more preferably 50 nm or more and 70 nm or less, even more preferably 50 nm or more and 60 nm or less, from the viewpoint of impregnation of the resin composition into the base material. If the average particle diameter is less than 1 nm, the distance between filaments of base material cannot be increased. If the average particle diameter is more than 100 nm, the silica nanoparticle cannot impregnate into spaces between filaments.

The charging amount of the silica nanoparticle is not particularly limited, but is preferably from 1 to 50 weight %, more preferably from 5 to 20 weight %, with respect to the total content of the epoxy resin composition. By having the charging amount of the silica nanoparticle within the above range, impregnation of the resin composition into the base material is particularly excellent.

The average particle diameter of the silica particle is larger than that of the silica nanoparticle, and is 0.1 μm or more and 5.0 μm or less, preferably 0.3 μm or more and 1.5 μm or less, from the viewpoint of impregnation of the resin composition into the base material.

The production method of the silica nanoparticle and the silica particle is not particularly limited. Examples of the production method include combustion methods such as the VMC (Vaporized Metal Combustion) method and the PVS (Physical Vapor Synthesis) method; fusion methods, in which crushed silica is subjected to flame fusion; precipitation methods; and gel methods. Among the above, the VMC method is particularly preferable.

The VMC method is a method of forming silica particles by charging silicon powders in chemical flame formed in oxygen-containing gas to burn followed by cooling. In the VMC method, the particle diameter of silica microparticle to be obtained can be adjusted by adjusting the particle diameter of silicon powder to be charged, the charging amount, temperature of flame, etc., thus, the silica nanoparticle and the silica particle having different particle diameter can be produced.

The charging amount of the silica particle is not particularly limited, but is preferably from 10 to 90 weight %, more preferably from 30 to 80 weight %, with respect to the total content of the epoxy resin composition. By having the charging amount of the silica particle within the above range, impregnation of the resin composition into the base material is particularly excellent.

The weight ratio of the charging amount of the silica particle with respect to the charging amount of the silica nanoparticle (weight of silica particle/weight of silica nanoparticle) is not particularly limited, but is preferably from 1 to 80, more preferably from 2 to 20. By having the weight ratio within the above range, the formability can be particularly improved. If the weight ratio is less than or exceeds the above range, impregnation of the resin composition into the base material deteriorates, and decrease in solder heat resistance and insulation reliability easily occurs due to generation of voids.

As the silica nanoparticle and the silica particle, for example, dry fused silica by the combustion method, wet sol-gel silica by the precipitation method or the gel method, etc. may be used, but are preferably used as a slurry having the silica dispersed in an organic solvent. Thereby, the dispersibility can be improved.

The organic solvent is not particularly limited, and may be appropriately selected according to the resin used for the epoxy resin composition. Examples of the organic solvent include MEK, cyclohexanone, and MIBK. A nano-size particle such as the silica nanoparticle easily aggregates, and often forms secondary aggregation, etc. upon being charged in a resin composition. By using particles in a form of slurry, such a secondary aggregation can be prevented.

The epoxy resin composition of the present invention preferably contains a cyanate resin. Thereby, the flame resistance of the epoxy resin composition can be improved.

A method of obtaining the cyanate resin is not particularly limited. An example of the method comprises the steps of: reacting a cyanogen halide compound with phenol or naphthol; and prepolymerizing them by heating or the like, if necessary. Also, commercial products prepared by the above method may be used.

A type of the cyanate resin is not particularly limited. Examples of the cyanate resin include bisphenol type cyanate resins such as novolac type cyanate resins, bisphenol A type cyanate resins, bisphenol E type cyanate resins and tetramethyl bisphenol F type cyanate resins; and naphtholaralkyl type cyanate resins.

The cyanate resin preferably has two or more cyanate groups (—O—CN) in the molecule. Examples of the cyanate resin include 2,2'-bis(4-cyanatophenyl)isopropylidene, 1,1'-bis(4-cyanatophenyl)ethane, bis(4-cyanato-3,5-dimethylphenyl)methane, 1,3-bis(4-cyanatophenyl-1-(1-methylethylidene))benzene, dicyclopentadiene type cyanate esters, phenol novolac type cyanate esters, bis(4-cyanatophenyl)thioether, bis(4-cyanatophenyl)ether, 1,1,1-tris(4-cyanatophenyl)ethane, tris(4-cyanatophenyl)phosphite, bis(4-cyanatophenyl)sulfone, 2,2-bis(4-cyanatophenyl)propane, 1,3-, 1,4-, 1,6-, 1,8-, 2,6- or 2,7-dicyanatonaphthalene, 1,3,6-tricyanatonaphthalene, 4,4-dicyanatobiphenyl, and cyanate resins obtained by the reaction between phenol novolac type or cresol novolac type multivalent phenol and cyanogen halide, and cyanate resins obtained by the reaction between naphtholaralkyl type multivalent naphthol and cyanogen halide. Among the above, the phenol novolac type cyanate resin is excellent in flame resistance and low-thermal expansion property, and 2,2-bis(4-cyanatophenyl)isopropylidene and dicyclopentadiene type cyanate ester are excellent in control of the crosslink density and in reliability of humidity resistance. Particularly, the phenol novolac type cyanate resins are preferable from the viewpoint of low-thermal expansion property. Further, one or more other kinds of cyanate resin may be used in combination, which is not particularly limited.

The cyanate resin can be used alone, or two or more kinds of cyanate resins having different weight-average molecular weight can be used in combination, or one or more kinds of cyanate resins and a prepolymer thereof can be used in combination.

The prepolymer is generally obtained by, for example, trimerizing the above cyanate resin by a heating reaction or the like, and is preferably used for adjusting formability and flowability of the epoxy resin composition.

The prepolymer is not particularly limited. For example, a prepolymer having a rate of trimerization from 20 to 50 weight % can be used. Thereby, excellent formability and flowability can be exhibited. The rate of trimerization can be determined, for example, by means of infrared spectroscopic analysis devices.

The charging amount of the cyanate resin is not particularly limited, but is preferably from 5 to 60 weight %, more preferably from 10 to 50 weight %, even more preferably from 10 to 40 weight %, with respect to the total content of the epoxy resin composition. By having the charging amount of the cyanate resin within the above range, improvement of heat resistance and flame resistance due to the cyanate resin can be more effectively exhibited. If the charging amount of the cyanate resin is less than the above lower limit, the thermal expansion property may increase, and the heat resistance may decrease. If the charging amount of the cyanate resin exceeds the above upper limit, the strength of prepreg produced using the epoxy resin composition may decrease.

The weight-average molecular weight of the cyanate resin is not particularly limited, but is preferably 100 or more and 3,000 or less. If the weight-average molecular weight of the cyanate resin is less than the above lower limit, the tackiness of the epoxy resin composition may be inferior. If the weight-average molecular weight of the cyanate resin exceeds the above upper limit, the handleability and impregnation of the epoxy resin composition may be inferior.

The weight average molecular weight of the cyanate resin can be measured, for example, by the gel permeation chromatography (GPC), and can be specified in terms of the polystyrene calibrated-weight average molecular weight.

In addition, it is preferable that the epoxy resin composition of the present invention contains a maleimide resin, which is not particularly limited. Thereby, the heat resistance can be improved.

The maleimide resin is not particularly limited. Examples of the maleimide resin include bismaleimide resins such as N,N'-(4,4'-diphenylmethane)bismaleimide, bis(3-ethyl-5-methyl-4-maleimidephenyl)methane, and 2,2-bis[4-(4-maleimidephenoxy)phenyl]propane. Further, one or more other kinds of maleimide resins may be used in combination, which is not particularly limited.

The maleimide resin may be used alone, or may be used in combination with a maleimide resin having different weight average molecular weight, or the maleimide resin and a prepolymer thereof may be used in combination.

The charging amount of the maleimide resin is not particularly limited, but is preferably from 1 to 30 weight %, more preferably from 5 to 20 weight %, with respect to the total content of the epoxy resin composition.

The weight-average molecular weight of the maleimide resin is not particularly limited, but is preferably 100 or more and 3,000 or less. If the weight-average molecular weight of the maleimide resin is less than the above lower limit, the tackiness of the epoxy resin composition may be inferior. If the weight-average molecular weight of the maleimide resin exceeds the above upper limit, the handleability and impregnation of the epoxy resin composition may be inferior.

The weight average molecular weight of the maleimide resin can be measured, for example, by the gel permeation chromatography (GPC), and can be specified in terms of the polystyrene calibrated-weight average molecular weight.

The epoxy resin composition of the present invention may use a phenol-based curing agent. Examples of the phenol-based curing agent include known curing agents such as phenol novolac resins, alkylphenol novolac resins, bisphenol A novolac resins, dicyclopentadiene type phenol resins, Zylock type phenol resins, terpene-modified phenol resins, and polyvinylphenols, which may be used alone or in combination of two or more kinds.

The charging amount of the phenol-based curing agent is not particularly limited, but the equivalence ratio (phenolic hydroxyl group equivalent/epoxy group equivalent) with the epoxy resin is preferably less than 1.0 and 0.1 or more. Thereby, there is few remaining unreacted phenol-based curing agent, and the hygroscopic heat resistance improves. Further, when high hygroscopic heat resistance is required, the charging amount of the phenol-based curing agent is particularly preferable in the range of from 0.2 to 0.5. Also, the phenol resin not only functions as a curing agent, but can also accelerate curing of the cyanate group with the epoxy group.

The weight-average molecular weight of the phenol-based resin of the phenol-based curing agent is not particularly limited, but is preferably 100 or more and 3,000 or less. If the weight-average molecular weight of the phenol-based resin is less than the above lower limit, the tackiness of the epoxy resin composition may be inferior. If the weight-average molecular weight of the phenol-based resin exceeds the above upper limit, the handleability and impregnation of the epoxy resin composition may be inferior.

The weight average molecular weight of the phenol-based resin can be measured, for example, by the gel permeation chromatography (GPC), and can be specified in terms of the polystyrene calibrated-weight average molecular weight.

In the epoxy resin composition of the present invention, a coupling agent is preferably used. It is possible to improve the wettability of an interface between the resin such as the epoxy resin and the silica nanoparticle and the silica particle being inorganic fillers. Thereby, the resin and the inorganic fillers can be uniformly fixed on the base material, and the heat resistance, particularly the solder heat resistance after absorption, can be improved.

The coupling agent is not particularly limited. Examples of the coupling agent include epoxy silane coupling agents, cationic cylane coupling agents, amino silane coupling agents, titanate coupling agents, and silicone oil type coupling agents.

The charging amount of the coupling agent is not particularly limited, but is preferably from 0.1 to 5 parts by weight, more preferably from 0.1 to 2 parts by weight, with respect to 100 parts by weight of the inorganic fillers (silica nanoparticle and silica particle). If the charging amount of the coupling agent is less than the above lower limit, the inorganic fillers cannot be sufficiently covered, thus, the effect of improving heat resistance may decrease. If the charging amount of the coupling agent exceeds the above upper limit, the reaction may be effected and the transverse strength, etc. may decrease.

The epoxy resin composition of the present invention may contain additives, if necessary, besides the components mentioned above to the extent that the characteristics are not deteriorated. Example of the additives besides the components mentioned above include curing accelerators such as imidazoles, triphenylphosphine, and quaternary phosphonium salts; surface conditioners such as acrylic polymer substances; and colorants such as dyes and pigments.

(Prepreg)

Next, the prepreg of the present invention will be explained. The prepreg of the present invention is a base material impregnated with the epoxy resin composition of the present invention. Since the solid epoxy resin is used as a main component of the epoxy resin composition in the present invention, a prepreg having low tackiness and being easy in handling can be obtained. Examples of the base material include glass fiber base materials such as glass woven fabric, glass nonwoven fabric and glass paper; paper; woven or nonwoven fabric formed of synthesized fiber such as aramid resins, polyester resins, aromatic polyester resins and fluorine resins; and woven or nonwoven fabric or mats formed of metallic fiber, carbon fiber and mineral fiber. The above base material may be used alone or in combination of two or more kinds. Among the above, glass fiber base material is preferable since the rigidity and dimensional stability of the prepreg can be improved.

When impregnating the base material with the epoxy resin composition of the present invention, the epoxy resin composition is dissolved in a solvent to prepare a resin varnish. It is preferable that the solvent has good solubility towards the epoxy resin composition, but a poor solvent may be used as the solvent to the extent that it does not have adverse effect. Examples of the solvent having good solubility include acetone, methyl ethyl ketone, methyl isobutyl ketone, cyclopentanone, cyclohexanone, dimethylformamide, dimethylacetamide and N-methylpyrrolidone. The solid content of the resin varnish (the total amount of all components except the solvent) is not particularly limited, but is preferably from 30 to 80 weight %, more preferably from 40 to 70 weight %, with respect to the total amount of all components except the solvent of the epoxy resin composition. Thereby, impregnation of the resin varnish into the base material can be improved.

Figure 1:
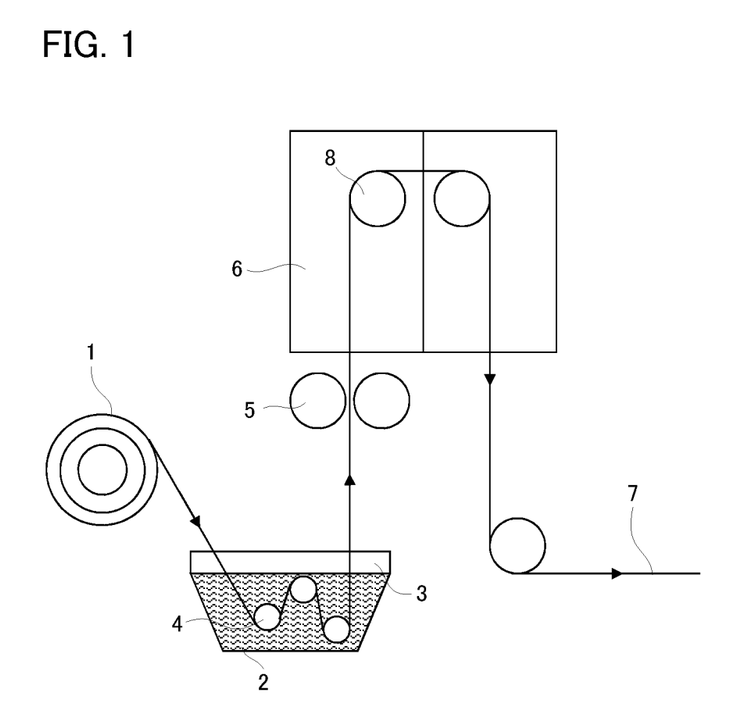
FIG. 1 is a schematic view showing an example of a device for impregnating coating used for production of a prepreg of the present invention.

Examples of methods for impregnating the base material with the resin varnish include a method of dipping the base material in the resin varnish, a method of applying the resin varnish on the base material by means of a coater, and a method of spraying the resin varnish on the base material by means of a spray. Among the above, the method of dipping the base material in the resin varnish is preferable. Thereby, impregnation of the epoxy resin composition into the base material can be improved. When dipping the base material in the resin varnish, general devices for impregnating coating may be used. As shown in FIG. 1, the base material 1 is dipped in the epoxy resin varnish 3 in an impregnation tank 2 to impregnate the base material 1 with the epoxy resin varnish 3. Here, the base material 1 is dipped in the epoxy resin varnish 3 by dip rolls 4 (three dip rolls in FIG. 1) provided to the impregnation tank 2. Next, the base materials 1 impregnated with the epoxy resin varnish 3 are pulled in a vertical direction, put side by side in a horizontal direction, and put through a pair of squeeze rolls or comma rolls (5 in FIG. 1 is squeeze roll) facing each other to adjust the coating amount of the epoxy resin varnish 3 on the base material 1. Thereafter, the base material 1 coated by the epoxy resin varnish 3 is heated at a certain temperature by a drier 6 to volatilize the solvent in the applied varnish and also to semi-cure the epoxy resin composition. Thus, a prepreg 7 is produced. The upper roll 8 in FIG. 1 rotates in the same direction as the running direction of the prepreg 7 to move the prepreg 7 in the running direction. The conditions of drying the solvent in the epoxy resin varnish are the temperature in the range of 90 to 180° C., and time of 1 to 10 minutes. Thereby, the semi-cured prepreg 7 can be obtained.

(Metal-Clad Laminate)

Next, the metal-clad laminate of the present invention will be explained. The metal-clad laminate of the present invention comprises the resin-impregnated base layer being the base material impregnated with the epoxy resin composition described above and a metal foil provided on at least one surface of the resin-impregnated base layer.

The metal-clad laminate of the present invention can be produced, for example, by laminating a metal foil on at least one surface of the above prepreg or a laminate having two or more prepregs of the above layered.

When there is one prepreg, the metal foil is laminated on each surface or on one surface of the prepreg. Also, two or more prepregs may be laminated. When two or more prepregs are laminated, a metal foil or film is laminated on each outermost surface or on one outermost surface of the layered prepregs. Next, the layered prepreg and metal foil are subjected to hot press molding. Thus, a metal-clad laminate can be obtained.

The heating temperature is not particularly limited, but is preferably from 120 to 220° C., more preferably from 150 to 200° C. The pressure to be applied is not particularly limited, but is preferably from 0.5 to 5 MPa, more preferably from 1 to 3 MPa. If necessary, post-curing may be performed at a temperature from 150 to 300° C. in a clean oven, etc.

Figure 2A:
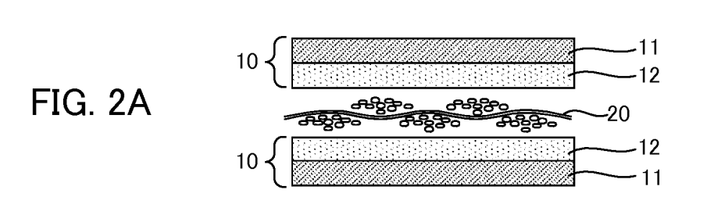
Figure 2B:
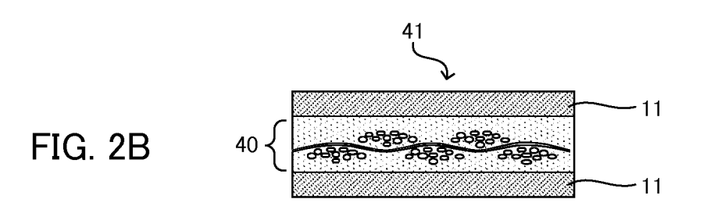
Figure 2C:
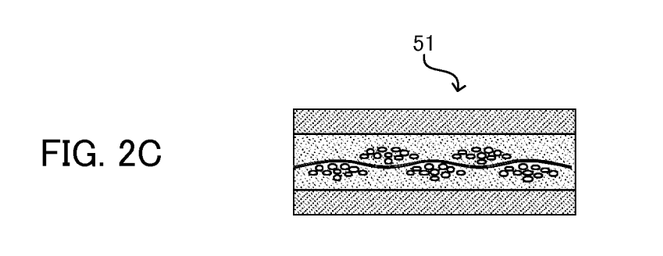
Figure 3A:
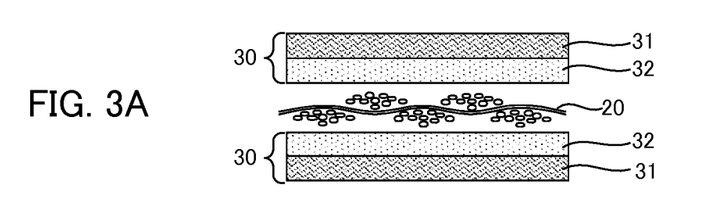
Figure 3B:
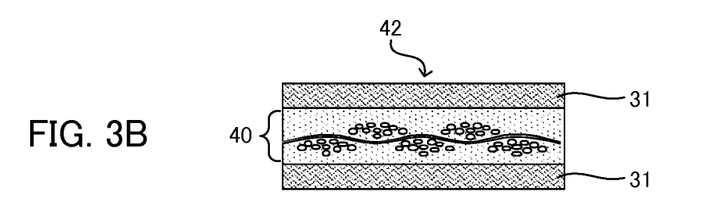
Figure 3C:
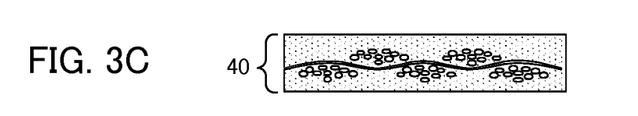
Figure 3D:
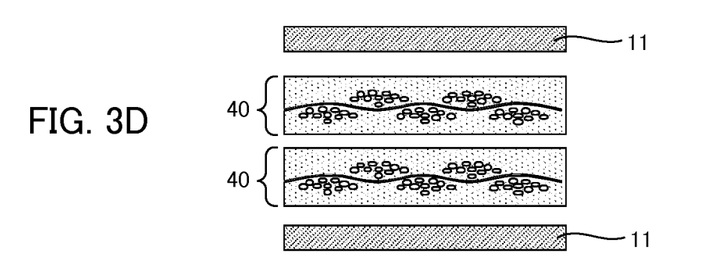
Figure 3E:
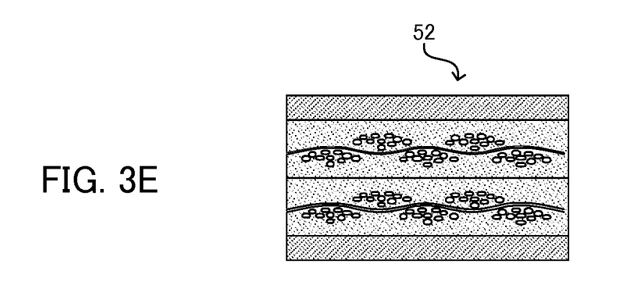

As another method of producing the metal-clad laminate of the present invention, a method of producing a metal-clad laminate using a metal foil with an insulating resin layer as shown in FIG. 2 can be exemplified. First, the metal foil 10 with the insulating resin layer, which is the metal foil 11 having a uniform insulating resin layer 12 coated by means of a coater, is prepared. The base material 20 such as glass fiber is sandwiched with the metal foils 10, 10 with the insulating resin layer by disposing the insulating resin layers facing inward (FIG. 2A). Then, laminate impregnation is performed under vacuum with heating at a temperature from 60 to 130° C. and a pressure from 0.1 to 5 MPa to form a prepreg 40. Thus, a prepreg 41 with the metal foils is obtained (FIG. 2B). Next, the prepreg 41 with the metal foils is directly subjected to hot press molding. Thus, a metal-clad laminate 51 can be obtained (FIG. 2C).

Further, as another method of producing the metal-clad laminate of the present invention, a method of producing a metal-clad laminate using a polymer film sheet with an insulating resin layer as shown in FIG. 3 can be exemplified. First, the polymer film sheet 30 with the insulating resin layer, which is a polymer film sheet 31 having a uniform insulating resin layer 32 coated by means of a coater, is prepared. The base material 2 is sandwiched with the polymer film sheets 30, with the insulating resin layer by disposing the insulating resin layers facing inward (FIG. 3A). Then, laminate impregnation is performed under vacuum with heating at a temperature from 60 to 130° C. and a pressure from 0.1 to 5 MPa to form a prepreg 40. Thus, a prepreg 42 with the polymer film sheets is obtained (FIG. 3B). Next, the polymer film sheet 31 on at least one surface of the prepreg 42 with the polymer film sheets is peeled (FIG. 3C), and a metal foil 11 is disposed on the surface where the polymer film sheet 31 is peeled (FIG. 3D). Then, hot press molding is performed. Thus, a metal-clad laminate 52 can be obtained (FIG. 3E). Furthermore, in the case of peeling the polymer film sheets on both surfaces, similarly as the prepreg described above, two or more prepregs can be laminated. In the case of laminating two or more prepregs, a metal-clad laminate is obtained by: disposing the metal foil or polymer film sheet on one or both outermost surfaces of the laminated prepreg; and performing hot press molding. As the condition of the hot press molding, the temperature is not particularly limited, but is preferably from 120 to 220° C., more preferably from 150 to 200° C. The pressure applied is not particularly limited, but is preferably from 0.1 to 5 MPa, more preferably from 0.5 to 3 MPa. Since the present invention forms the prepreg with the polymer film sheet, the surface smoothness of the prepreg becomes high and low-pressure molding is possible. Also, if necessary, post-curing may be conducted at 150 to 300° C. by means of a clean oven, etc.

In addition, as another method, the metal-clad laminate of the present invention may be produced by the method disclosed in WO2007/040125, which is a method of producing a metal-clad laminate comprising the steps of: (a) sandwiching a base material with the insulating resin layer side of a first and second metal foils with an insulating resin layer, each of which has the insulating resin layer formed on one surface, and bonding them under reduced pressure; and (b) after bonding, performing heat treatment at the temperature of or higher than the melting temperature of the insulating resin. The insulating resin layer is formed by the epoxy resin composition of the present invention.

The condition of reduced pressure in the step (a) is preferably reducing 700 Torr or more from ordinary pressure, more preferably 740 Torr or more from ordinary pressure.

The heating temperature in the step (b) is the melting temperature of the insulating resin or higher, that is, the melting temperature of the epoxy resin composition of the present invention or higher. By the step (b), voids remained at the time when the metal foil with the insulating layer and the base material are bonded can be vanished. Hence, a metal-clad laminate having significantly small number of unfilled parts or substantially having no unfilled part can be produced.

Figure 4A:
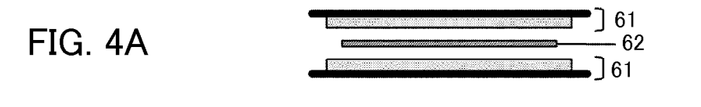
Figure 4B:
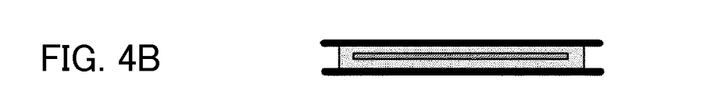
Figure 4C:
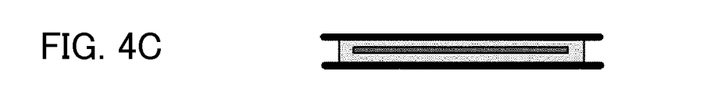

As an embodiment of the metal-clad laminate produced by the steps (a) to (b), for example, as shown in FIGS. 4A to 4C, an embodiment, which has metal foils having larger width than the base material 62 as a first and second metal foils 61, 61 with the insulating resin layer, and has the insulating resin layers having larger width than the base material 62, can be exemplified. In this embodiment, each of the first and second metal foils 61, 61 with the insulating resin layer can be bonded with the base material 62 in an inner region (the region where the base material 62 is present) in the width direction of the base material 62 in the step (a). Also, each insulating resin layer surface of the first and second metal foils 61, 61 with the insulating resin layer can be directly bonded (FIG. 4B) in an outer region (the region where the base material 62 is not present) in the width direction of the base material 62. Since the bonding is performed under reduce pressure, even if unfilled parts remain inside the base material 62 or at the bonded surface between the metal foil 61 with the insulating resin layer and the base material 62, the unfilled parts can be changed to voids. Hence, by the heat treatment of the step (b), the unfilled parts can be easily vanished. Thereby, it can be prevented in the step (b) that air comes in from the peripheral part in the width direction and new voids are formed (FIG. 4C).

One or both of the first and second metal foils 61, 61 with the insulating resin layer may have an insulating resin layer having the same width as that of the base material 62. However, from the viewpoint of increasing the easiness of sealing the base material with the insulating resin layer, and producing a metal-clad laminate having few voids, the embodiment shown in FIGS. 4A to 4C are preferable.

Figure 5A:
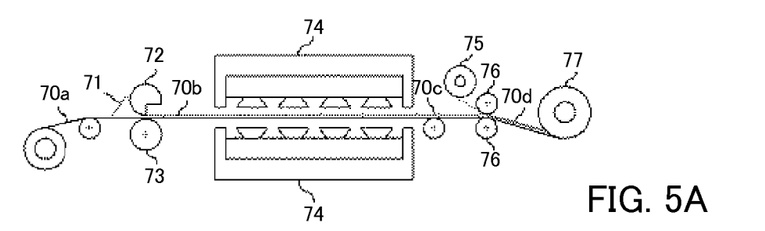
FIG. 5A is a schematic sectional side view showing an example of an embodiment of a device for producing a metal foil with an insulating resin layer used for producing the metal-clad laminate of the present invention.
Figure 5B:
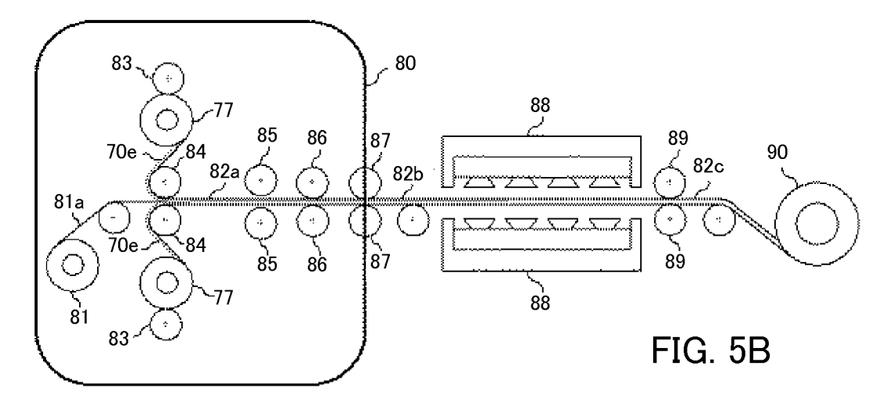
FIG. 5B is a schematic sectional side view showing an example of embodiment of a device for producing the metal-clad laminate of the present invention.

FIG. 5A is a schematic sectional side view showing an example of an embodiment of a device for producing the metal foil with the insulating resin layer used for producing the metal-clad laminate in FIG. 4, etc. FIG. 5B is a schematic sectional side view showing an example of an embodiment of a device for producing the metal-clad laminate.

In FIG. 5A, the metal foil 70a may be, for example, along sheet in a form of scroll, etc. and can be supplied by continuously releasing the scroll. A predetermined amount of an insulating resin liquid 71 is continuously supplied on the metal foil 70a by a feeding device (not shown) of the insulating resin liquid. As the insulating resin liquid, a coating liquid having the epoxy resin composition of the present invention dissolved and dispersed in a solvent can be used. The coating amount of the insulating resin liquid 71 can be controlled by clearance between a comma roll 72 and a backup roll 73 of the comma roll 72. The metal foil 70b having the predetermined amount of insulating resin liquid coated is conveyed through lateral transport type hot air drying machines 74, 74. The organic solvent, etc. contained in the insulating resin liquid are substantially removed by drying, if necessary, a curing reaction may be proceeded halfway, and a metal foil 70c with an insulating resin layer is obtained. The metal foil 70c with the insulating resin layer may be wound as it is. Also, a protecting film 75 may be layered on the surface having the insulating resin layer formed by means of laminate rolls 76, 76. Thus obtained metal foil 70d with the insulating resin layer having the protecting film 75 laminated may be wound to obtain a metal foil 77 with an insulating resin layer in a form of scroll.

FIG. 5B is a schematic sectional side view showing an example of a device capable of conducting the steps (a) to (b). In FIG. 5B, the step (a) is performed using a vacuum lamination apparatus 80. Inside the vacuum lamination apparatus 80, the metal foils 77, 77 with the insulating resin layer and the base material 81 obtained in the step (a) are placed so that they can be fed continuously. Since the protecting film is laminated on the surface of the insulating resin layer of the metal foils 77, 77 with the insulating resin layer, the metal foils 77, 77 with the insulating resin layer are continuously fed by a winding roll 83 while peeling the protecting film (metal foils 70e, 70e with the insulating resin layer). Also, the base material 81a is continuously fed from the base material 81 in a form of scroll. The metal foils 70e, 70e with the insulating resin layer sandwich the base material 81a (fiber cloth) on their insulating resin layer side, and are boned by laminate rolls 84, 84. At this time, the insulating resin layer is an uncured product or semicured product almost in a solventless state and has flowability by thermal fusion, thus, the base material 81a is impregnated with the insulating resin layer. A joined article 82a after bonding may proceed to the next step. Also, the temperature to bond the metal foil with the insulating resin layer and the base material can be adjusted by the temperature and pressure of laminate rolls 85, 85, 86, 86, 87, 87. The joined article 82b after bonding is conveyed through lateral transport type hot air drying machines 88, 88 to conduct heat treatment at the temperature of or higher than the melting temperature of the insulating resin. Thereby, the unfilled parts remained inside the joined article can be vanished. Thus obtained metal-clad laminate 82c after the heat treatment is sandwiched between pinch rolls 89, 89, and continuously wound. Thus, a metal-clad laminate 90 in a form of scroll can be obtained.

In addition, in the metal-clad laminate of the present invention, flow of the epoxy resin composition is small upon the hot press molding since the viscosity of the epoxy resin composition constituting the metal-clad laminate is high. Thereby, uneven movement of molten resin in the laminate during hot press can be inhibited, thread-like unevenness on the surface of the metal-clad laminate can be prevented, and the thickness can be uniform.

(Printed Wiring Board)

Next, the printed wiring board of the present invention will be explained. The printed wiring board of the present invention is a printed wiring board using the metal-clad laminate described above for an inner layer circuit board. Also, the printed wiring board of the present invention is a printed wiring board using the prepreg described above to form an insulating layer on an inner layer circuit. Also, the printed wiring board of the present invention uses the above described epoxy resin composition to form the insulating layer on the inner layer circuit. Thereby, a printed wiring board excellent in heat resistance and flame resistance, and not having a trouble of conduction failure upon the plating process by the ENEPIG method without surface treatment.

In the present invention, the printed wiring board is an insulating layer on which a circuit is formed by electric conductor such as a metal foil, and may be a single-sided printed wiring board (single-layer board), a double-sided printed wiring board (double-layer board), or a multilayer printed wiring board (multilayer board). The multilayer printed wiring board is a printed wiring board obtained by: laminating three or more layers by the plating through-hole method or build-up method; and layering an insulating layer on the inner layer circuit board followed by hot press molding.

As the inner layer circuit board, an inner layer circuit board obtained by, for example, forming a predetermined conductor circuit on the metal layer of the metal-clad laminate of the present invention by etching, etc., and subjecting the conductor circuit part to the black oxide treatment, can be suitably used.

As the insulating layer, the prepreg of the present invention, or a resin film formed of the epoxy resin composition of the present invention can be used. In the case of using the prepreg or the resin film formed of the epoxy resin composition as the insulating layer, the inner layer circuit board may be one not formed of the metal-clad laminate of the present invention.

Hereinafter, as a representative example of the printed wiring board of the present invention, a multilayer printed wiring board, wherein the metal-clad laminate of the present invention is used for the inner layer circuit board, and the prepreg of the present invention is used for the insulating layer, will be described.

A conductor circuit is formed on one or both surfaces of the metal-clad laminate, thus, the inner layer circuit board is formed. If necessary, through-holes may be formed by drill processing or laser processing, and the upper and lower sides may be electrically connected by plating, etc. The prepreg is layered on the inner layer circuit of the inner layer circuit board and subjected to hot press, thereby, an insulating layer is formed. Similarly, by alternatively forming the conductor circuit layer having the conductor circuit formed by etching, etc. and the insulating layer, a multilayer printed wiring board can be obtained.

Specifically, the prepreg and the inner layer circuit board are layered, and subjected to vacuum hot press molding by means of a vacuum pressurized laminating device. Thereafter, heat-curing is performed on the insulating layer by means of a hot air drying machine, etc. The condition of hot press molding is not particularly limited. An example of the condition is a temperature from 60 to 160° C. and a pressure from 0.2 to 3 MPa. The condition of heat-curing is not particularly limited. An example of the condition is a temperature from 140 to 240° C. and time of 30 to 120 minutes.

In the next step, an opening is formed in the insulating layer by irradiation of laser. Before that, it is necessary to peel the base material (polymer film sheet 31, protecting film 75, etc.) of the insulating layer. The base material may be peeled after forming the insulating layer, before performing heat-curing, or after performing heat-curing without problems.

Next, an opening is formed in the insulating layer by irradiation of laser. As the laser, an excimer laser, a UV laser, a carbonic acid gas laser, etc. can be used.

It is preferable to perform a process to remove resin residues (smear), etc., i.e. desmear, after laser irradiation by an oxidant such as permanganate, bichromate or the like. If desmear is not sufficient and desmearing property is not sufficiently secured, the electrical conductivity between the upper layer metal wiring and the lower layer metal wiring may not be able to be sufficiently secured due to smear, even if the metal plating process is performed on the opening. Also, smooth surface of the insulating layer can be simultaneously roughed with desmear, thereby, the adhesion between conductive wiring circuit formed in the following metal plating and the insulating layer can be increased.

Next, an outer layer circuit is formed. A method of forming the outer layer circuit comprises the steps of: performing metal plating to connect the insulating resin layers; and performing etching to form the outer layer circuit pattern.

Another insulating layer may be laminated on the inner layer circuit followed by forming a circuit similarly as above to form an outer layer circuit. In the case of a multilayer printed wiring board, after the outer layer circuit is formed, a solder resist is formed on the outermost layer. The forming method of the solder resist is not particularly limited. The examples include a method of forming a solder resist by laminating a dry film type solder resist on the outer layer circuit followed by exposure and development, and a method of forming a solder resist by printing a liquid resist followed by exposure and development. To use the obtained multilayer printed wiring board for a semiconductor device, electrode parts for connection are provided to the multilayered printed wiring board for mounting semiconductor elements. Each of the electrode parts for connection may be appropriately covered with a metal film such as gold plating, nickel plating or solder plating.

As a representative method of the gold plating, there is a nickel-palladium-gold electroless plating method, which comprises the steps of: subjecting the electrode part for connection to preprocessing by a cleaner, etc.; thereafter supplying a palladium catalyst; and then successively performing electroless nickel plating process, electroless palladium plating process, and electroless gold plating process.

In the case of the ENEPIG method, immersion gold plating process is performed at the electroless gold plating process of the nickel-palladium-gold electroless plating method. By providing an electroless palladium plating film between an electroless nickel plating film being a substrate plating and an electroless gold plating film, the diffusion prevention property and corrosion resistance of the conductive material in the electrode part for connection can be improved. Since diffusion of the substrate nickel plating film can be prevented, the reliability of Au—Au bonding improves. Also, since oxidation of nickel by gold can be prevented, the reliability of lead-free solder bonding having high heat load improves. Generally in the ENEPIG method, it is necessary to conduct the surface treatment before the electroless palladium plating process to prevent occurrence of conduction failure in the plating step. A significant conduction failure may cause short circuit between adjacent terminals. On the other hand, the conduction failure is not caused in the printed wiring board of the present invention without surface treatment, thus, the plating process can be easily performed.

(Semiconductor Device)

Next, the semiconductor device of the present invention will be explained. On the above obtained printed wiring board, semiconductor elements having solder bumps are mounted. The semiconductor elements and the printed wiring board are connected via the solder bumps. Then, the space between the printed wiring board and the semiconductor element is filled with a liquid encapsulating resin. Thus, a semiconductor device is formed. The solder bumps are preferably constituted with an alloy of tin, lead, silver, copper, bismuth, etc.

A method of connecting the semiconductor element and the printed wiring board may be as follows. After setting the positions of the electrode parts for connection and the solder bumps of the semiconductor elements on the substrate, by means of a flip chip bonder, etc., solder bumps are heated to the temperature of or higher than the melting point by means of an IR reflow device, heated plate, or any other heating device, thereby, the printed wiring board and the solder bumps are fused to join. In order to improve the connection reliability, a layer of metal having relatively low melting point such as solder paste, etc. may be preliminarily formed at the electrode part for connection on the printed wiring board. Before this bonding step, flux may be applied on the surface of the solder bumps and/or electrode part for connection on the printed wiring board. Thereby, the connection reliability can be improved.

EXAMPLES

The present invention will be hereinafter explained in detail with reference to Examples and Comparative examples. The present invention may not be limited thereto.

Example 1

(1) Preparation of Resin Varnish Containing Epoxy Resin Composition

Firstly, 9.950 weight % of silica nanoparticle (average particle diameter: 56 nm) and 54.725 weight % of particle A (silica; product name: SO25R; manufactured by ADMATECHS Co., Ltd.; average particle diameter: 0.5 μm) were dispersed in dimethylacetamide and MEK (ratio: dimethylacetamide:MEK=1:3) to prepare an inorganic filler slurry having 60 weight % of inorganic filler (silica nanoparticle and silica particle). Next, 9.800 weight % of solid epoxy resin A (product name: NC3000; manufactured by NIPPON KAYAKU CO., LTD.; biphenylaralkyl type epoxy resin; weight average molecular weight: 1,300; softening point: 57° C.; epoxy equivalent: 276 g/eq), 17.500 weight % of cyanate resin A (product name: PT30; manufactured by LONZA Japan; novolac type cyanate resin; weight average molecular weight: 380), 7.700 weight % of phenol resin A (product name: MEH7851; manufactured by MEIWA PLASTIC INDUSTRIES, LTD.) as a curing agent, and 0.325 weight % of epoxy silane coupling agent (product name: A187; manufactured by Nippon Unicar Company Limited) were dissolved and mixed in the inorganic filler slurry, and agitated by means of a high speed agitator. Thus, a resin varnish having the epoxy resin composition in a solid content of 70 weight % was prepared.

(2) Production of Prepreg

The resin varnish was impregnated into glass woven fabric (product name: WEA-2116; manufactured by Nitto Boseki Co., Ltd.; E glass woven fabric; thickness: 94 μm). The glass woven fabric was dried in a heating oven at 180° C. for two minutes. Thus, a prepreg having the epoxy resin composition in an amount of about 49 weight % based on solid content was obtained.

(3) Production of Metal-Clad Laminate

Four prepregs obtained above were layered. The layered prepregs were sandwiched by a copper foil having a thickness of 12 μm (product name: 3EC-VLP foil; manufactured by Mitsui Mining & Smelting Co., Ltd.), and subjected to hot press molding at 220° C. under the pressure of 3 MPa for two hours. Thus, a metal-clad laminate having copper foils on both surfaces having a thickness of 0.124 mm was obtained.

(4) Production of Printed Wiring Board

After holes were made in the metal-clad laminate having the copper foils on both surfaces by means of a drill, the copper foil on the upper surface side was electrically connected with the copper foil on the lower surface side by electroless plating. Then, the copper foils on the upper and lower surface sides were etched to form inner layer circuits on both surface sides (L (width of conductor circuit (μm))/S (width between conductor circuits (μm))=50/50).

Next, a liquid medicine (product name: TEC SO-G; manufactured by Asahi Denka Co., Ltd.) comprising a hydrogen peroxide solution and sulfuric acid as main components was sprayed on the inner layer circuits to allow roughening treatment, thereby, irregularities were formed.

Next, the above prepreg was laminated on each inner layer circuit by a vacuum-laminating device. After heat-curing at 170° C. for 60 minutes, a laminate was obtained.

Openings (blind via holes) of ϕ60 μm were formed by means of a $CO_2$ laser. Such a prepreg was dipped in a swelling agent (product name: Swelling Dip Securiganth P; manufactured by Atotech Japan K.K.) having a temperature of 70° C. for 5 minutes, further dipped in a potassium permanganate aqueous solution (product name: Concentrate Compact CP; manufactured by Atotech Japan K.K.) having a temperature of 80° C. for 15 minutes, and then neutralized to allow roughening treatment.

Then, after degreasing, providing catalyst and activation, a power supply layer being an electroless copper plating film having a thickness of about 0.5 μm was formed. An ultraviolet sensitive dry film (product name: AQ-2558; manufactured by Asahi Kasei Corporation) having a thickness of 25 μm was laminated on the surface of the power supply layer by means of a hot roll laminator. Thereon, a chromium deposition mask (manufactured by Touwa Process Co., Ltd.) having a pattern with a minimum L/S of 20 μm/20 μm was positioned followed by exposure by means of an exposure equipment (product name: UX-1100SM-AJN01; manufactured by Ushio Inc.). Then, development was performed using a sodium carbonate aqueous solution, and a plated resist was formed.

Then, electrolytic copper plating (product name: 81-HL; manufactured by Okuno Chemical Industries Co., Ltd.) was performed by 3 A/$dm^2$ for 30 minutes using the power supply layer as an electrode to form a copper wiring having a thickness of about 25 μm. The plated resist was peeled by means of a two-step peeler. As for the liquid medicines, a monoethanolamine liquid (product name: R-100; manufactured by MITSUBISHI GAS CHEMICAL COMPANY, INC) was used for a alkali aqueous solution layer of the first step, an aqueous solution (product name: Macudizer 9275, 9276; manufactured by MacDermid Inc.) comprising potassium permanganate and sodium hydroxide as main components was used as an oxidizable resin etchant of the second step, and an acidic amine aqueous solution (product name: Macudizer 9279; manufactured by MacDermid Inc.) was used for neutralization.

The power supply layer was dipped in an ammonium persulfate aqueous solution (product name: AD-485; manufactured by Meltex Inc.), and removed by etching to ensure insulation between wirings. Next, the insulating layer was subjected to final curing at 200° C. for 60 minutes. Finally, a solder resist (product name: PSR4000/AUS308; manufactured by TAIYO INK MFG, CO., LTD.) was formed on the surface of the circuit. Thus, a printed wiring board was obtained.

The electrode parts for connection of the printed wiring board, which correspond to the arrangement of solder bumps of the semiconductor element, was subjected to the ENEPIG process. The ENEPIG process was conducted by the steps of: [1] cleaner process, [2] soft etching process, [3] acid washing process, [4] pre-dip process, [5] supplying palladium catalyst, [6] electroless nickel plating process, [7] electroless palladium plating process, and [8] electroless gold plating process.

(5) Production of Semiconductor Device

The printed wiring board after the ENEPIG process was cut to the size of 50 mm×50 mm and used. A semiconductor element (TEG chip; size: 15 mm×15 mm; thickness: 0.8 mm) having Sn/Pb eutectic solder bumps were used, wherein a circuit protecting film of the semiconductor element was formed by a positive-working photosensitive resin composition (product name: CRC-8300; manufactured by Sumitomo Bakelite Co., Ltd.). The assembly of a semiconductor device was conducted as follows. First, a flux material was uniformly applied on the solder bumps by a transfer method. Next, the semiconductor element was mounted on the printed wiring board by hot press by means of a flip chip bonder. After the solder bumps were fused to join by means of an IR reflow furnace, filling of a liquid encapsulating resin (product name: CRP-41525; manufactured by Sumitomo Bakelite Co., Ltd.) and curing of the liquid encapsulating resin were performed. Thus, a semiconductor device was obtained. The curing conditions of the liquid encapsulating resin were the temperature of 150° C. and time of 120 minutes.

Example 2

Except that the components of the resin varnish containing the epoxy resin composition was changed to 8.400 weight % of solid epoxy resin A, 15.000 weight % of cyanate resin A, 6.600 weight % of phenol resin A, 9.950 weight % of silica nanoparticle, 59.700 weight % of particle B (silica; product name: SO32R; manufactured by ADMATECHS Co., Ltd.; average particle diameter: 1.1 µm), and 0.350 weight % of epoxy silane coupling agent, Example 2 was performed similarly as Example 1.

Example 3

Except that the components of the resin varnish containing the epoxy resin composition was changed to 13.860 weight % of solid epoxy resin B (product name: EXA7320; manufactured by DIC Corporation; naphthalene type; weight average molecular weight: 750; softening point: 58° C.; epoxy equivalent: 250 g/eq), 13.860 weight % of cyanate resin A, 9.950 weight % of silica nanoparticle, 61.690 weight % of particle A, 0.280 weight % of curing catalyst A (product name: Curezole 2P4MHZ; manufactured by SHIKOKU CHEMICALS CORPORATION; 2-phenyl-4-methyl-5-hydroxymethylimidazole), and 0.360 weight % of epoxy silane coupling agent, Example 3 was performed similarly as Example 1.

Example 4

Except that the amount of silica nanoparticle was changed to 6.965 weight %, and 64.675 weight % of particle B was used instead of particle A, Example 4 was performed similarly as Example 3.

Example 5

Except that 0.280 weight % of curing catalyst B (product name: C05-MB; manufactured by Sumitomo Bakelite Co., Ltd.; tetraphenylphosphonium bis(naphthalene-2,3-dioxy) phenyl silicate) was used instead of curing catalyst A, Example 5 was similarly performed as Example 4.

Example 6

Except that the components of the resin varnish containing the epoxy resin composition were changed to 15.444 weight % of solid epoxy resin A, 1.931 weight % of semisolid epoxy resin D (product name: HP4032D; manufactured by DIC; naphthalene type; molecular weight: 280; epoxy equivalent: 143 g/eq), 12.741 weight % of cyanate resin B (a derivative of SN485 (product name); naphthol type; manufactured by Nippon Steel Chemical Co., Ltd.), 8.494 weight % of maleimide resin, 9.950 weight % of silica nanoparticle, 41.790 weight % of particle A, 8.955 weight % of particle C (silicone composite powder; product name: KMP600; manufactured by Shin-Etsu Chemical Co., Ltd.), 0.390 weight % of curing catalyst C (zinc octylate), and 0.305 weight % of epoxy silane coupling agent, Example 6 was similarly performed as Example 1. Herein, the epoxy resin is in the "semisolid" state means that a part of the epoxy resin has flowability in a solventless state and the other part does not have flowability in the range of ordinary temperature (due to the melting point at around ordinary temperature).

Example 7

Reference Example

Except that the components of the resin varnish containing the epoxy resin composition were changed to 17.820 weight % of solid epoxy resin C (product name: N665EXPS; manufactured by DIC; cresol novolac type; weight average molecular weight: 1250; softening point: 58° C.; epoxy equivalent: 201 g/eq), 11.880 weight % of phenol resin B (product name: PR51470; manufactured by Sumitomo Bakelite Co., Ltd.), 9.950 weight % of silica nanoparticle, 29.850 weight % of silica particle A, 19.900 weight % of particle D (aluminium hydroxide; product name: BE033; manufactured by Nippon Light Metal Co., Ltd.; average particle diameter: 2 µm), 9.950 weight % of particle E (talc; product name: LMS200; manufactured by Fuji Talc Industrial Co., Ltd.; average particle diameter: 5 µm), 0.300 weight % of curing catalyst D (dicyandiamide), and 0.350 weight % of epoxy silane coupling agent, Example 7 was similarly performed as Example 1.

Example 8

Except that 0.280 weight % of curing catalyst F (manufactured by Sigma-Aldrich Co.; tetraphenyl phosphonium tetraphenyl borate) was used instead of curing catalyst A, Example 8 was similarly performed as Example 4.

Example 9

Except that the production method of the metal-clad laminate was changed to the method below, the components of the resin varnish containing the epoxy resin composition was the same as that of Example 8. The resin varnish was casted and coated on the mat surface of a copper foil (product name: 3EC-VLP foil; manufactured by Mitsui Mining & Smelting Co., Ltd.) having a thickness of 12 µm. Then, the solvent was volatilized and dried at 140° C. for 10 minutes, so that the thickness of the resin layer was 30 µm. A glass woven fabric (product name: WEA-2116; manufactured by Nitto Boseki Co., Ltd.; thickness: 94 µm; E glass woven fabric) was sandwiched with the copper foils with the resin layer so that the resin layers face the glass woven fabric. Thereto, hot press was performed in a vacuum press at 140° C. with pressure of 0.5 MPa for one minute to impregnate the epoxy resin composition into the glass woven fabric. Next, hot press molding was performed at 220° C. with pressure of 1 MPa for two hours. Thus, a metal-clad laminate provided with copper foils having a thickness of 0.124 mm on both surfaces was obtained.

Comparative Example 1

Except that the silica nanoparticle was not used and the amount of particle B was changed to 69.650 weight %, Comparative example 1 was similarly performed as Example 2.

Comparative Example 2

Except that the silica nanoparticle was not used and the amount of particle B was changed to 71.640 weight %, Comparative example 2 was similarly performed as Example 5.

Comparative Example 3

Except that the components of the resin varnish containing the epoxy resin composition were changed to 29.700 weight % of liquid epoxy resin E (product name: ZX1059; manufactured by Nippon Steel Chemical Co., Ltd.; molecular weight: 330; epoxy equivalent: 165 g/eq), 9.950 weight % of silica nanoparticle, 59.700 weight % of silica particle B, 0.300 weight % of curing catalyst E (product name: 2PHZ; manufactured by SHIKOKU CHEMICALS CORPORATION; 2-phenyl-4,5-dihydroxymethylimidazole), and 0.350 weight % of epoxy silane coupling agent, Comparative example 3 was similarly performed as Example 1. Herein, the epoxy resin is in the "liquid" state means that the epoxy resin has flowability in a solventless state in the range of ordinary temperature.

The properties were evaluated for the prepregs, metal-clad laminates, printed wiring boards, and semiconductor devices obtained by Examples and Comparative examples. The items and contents of evaluation are as below. The obtained results are shown in Tables 1 and 2.

(1) Impregnation

The obtained metal-clad laminate was cross-sectionally observed. A scanning electron microscope was used for the cross-sectional observation. Impregnation of the resin composition into the base material was evaluated as follows from the area of void which was cross-sectionally observed.

○: nonimpregnated voids were observed at less than 10% of total area, but the metal-clad laminate was at practical level.

Δ: nonimpregnated voids were observed at 10 to 30% of total area, and the metal-clad laminate was not at practical level.

x: nonimpregnated voids were observed at 50% or more of total area, and the metal-clad laminate was not at practical level.

(2) Solder Heat Resistance

A sample of 50 mm width grid was cutout from the obtained metal-clad laminate. The ¾ area thereof was etched. After processed by means of a pressure cooker at 121° C. for two hours, the sample was dipped in a solder at 260° C. for 30 seconds. Then, presence of swelling was observed. The symbols refer to the following:

○: no particular swelling
x: swelling was observed (3) Tackiness 100 prepregs produced were layered and left at 25° C. for 72 hours. Thereafter, the prepreg was peeled and the degree of resin peeling was observed, and evaluated as follows.

○: no resin was peeled off.
x: resin was peeled off.

(4) Processability for ENEPIG

Metal precipitate between thin lines on the printed wiring board produced by the ENEPIG process according to the steps below was observed by SEM. The printed wiring board produced in each Example and Comparative example is referred to as a test piece.

[1] Cleaner Process

The test piece was dipped in a cleaner solution (product name: ACL-007; manufactured by Uyemura & Co., Ltd.) having a temperature of 50° C. for five minutes followed by water washing for three times.

[2] Soft Etching Process

After the cleaner process, the test piece was dipped in a soft etchant (a mixed solution of sodium persulfate and sulfuric acid) having a temperature of 25° C. for one minute followed by water washing for three times.

[3] Acid Washing Process

After the soft etching process, the test piece was dipped in sulfuric acid having a temperature of 25° C. for one minute followed by water washing for three times.

[4] Pre-Dip Process

After the acid washing process, the test piece was dipped in sulfuric acid having a temperature of 25° C. for one minute.

[5] Supplying Palladium Catalyst

After the pre-dip process, KAT-450 (product name; manufactured by Uyemura & Co., Ltd.) was used as a palladium catalyst supplying solution to supply a palladium catalyst to a terminal part. The test piece was dipped in the palladium catalyst supplying solution having a temperature of 25° C. for two minutes followed by water washing for three times.

[6] Electroless Nickel Plating Process

After supplying the palladium catalyst, the test piece was dipped in an electroless Ni plating bath (product name: NPR-4; manufactured by Uyemura & Co., Ltd.) having a temperature of 80° C. for 35 minutes followed by water washing for three times.

[7] Electroless Palladium Plating Process

After the electroless nickel plating process, the test piece was dipped in an electroless palladium plating bath (product name: TPD-30; manufactured by Uyemura & Co., Ltd.) having a temperature of 50° C. for five minutes followed by water washing for three times.

[8] Electroless Gold Plating Process

After the electroless palladium plating process, the test piece was dipped in an electroless gold plating bath (product name: TWX-40; manufactured by Uyemura & Co., Ltd.) having a temperature of 80° C. for 30 minutes followed by water washing for three times.

The symbols refer to the following:

○: the rate of the area of metal precipitate parts in the area between circuits within 50 μm×50 μm of the test piece was 5% or less
x: the rate of the area of metal precipitate parts in the area between circuits was 5% or more (5) Flame Resistance In the production of the metal-clad laminate, 10 prepregs were layered, and the layered prepregs were sandwiched by copper foils having a thickness of 12 μm. Thereto, hot press molding was performed at 220° C. with pressure of 3 MPa for two hours. Thus, a double-sided metal-clad laminate having a thickness of 1.02 mm was obtained. The copper foil of the obtained metal-clad laminate was etched. In accordance with UL-94 standard, a test piece having a thickness of 1.0 mm was measured by a vertical method and evaluated as follows.

V-0: five test pieces burned partially or did not burn at all.

Nonstandard: one or more out of five test pieces burned down.

NA: it was not able to form a test piece since impregnation of the composition was not possible.

(6) Generation of Thread-Like Unevenness

Figure 6:
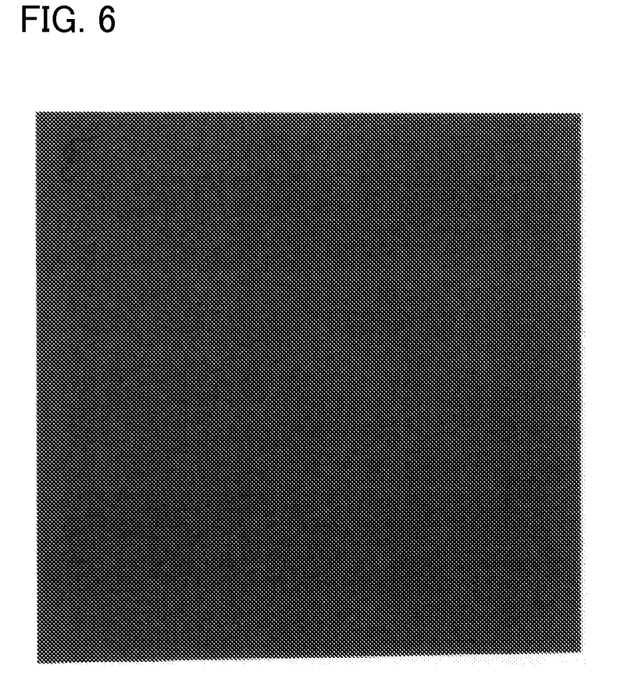
FIG. 6 is a photograph showing a surface of metal foil layer of the metal-clad laminate obtained in Example 1.

FIG. 6 is a photograph showing a surface of the metal-clad laminate obtained in Example 1. As shown in the photograph, thread-like unevenness was not observed on the surface of the metal foil layer of the metal-clad laminate in Example 1.

TABLE 1

| | | | | Example 1 | Example 2 | Example 3 | Example 4 | Example 5 | Example 6 |
|---|---|---|---|---|---|---|---|---|---|
| Epoxy resin | A | (solid) | NC3000 | 9.800 | 8.400 | | | | 15.444 |
| | B | | EXA7320 | | | 13.860 | 13.860 | 13.860 | |
| | C | | N665EXPS | | | | | | |
| | D | (semisolid) | HP4032D | | | | | | 1.931 |
| | E | (liquid) | ZX1059 | | | | | | |
| Cyanate resin | A | PT30 | | 17.500 | 15.000 | 13.860 | 13.860 | 13.860 | |
| | B | SN485 derivative | | | | | | | 12.741 |
| Phenol resin | A | MEH7851 | | 7.700 | 6.600 | | | | |
| | B | PR51470 | | | | | | | |
| Maleimide resin | | BMI70 | | | | | | | 8.494 |
| Silicanano particle | | | nanosilica | 9.950 | 9.950 | 9.950 | 6.965 | 6.965 | 9.950 |
| Particle | A | silica | SO25R | 54.725 | | 61.690 | | | 41.790 |
| | B | silica | SO32R | | 59.700 | | 64.675 | 64.675 | |
| | C | silicone composite powder | KMP600 | | | | | | 8.955 |
| | D | aluminium hydroxide | BE033 | | | | | | |
| | E | talc | LMS200 | | | | | | |
| Curing catalyst | A | 2P4MHZ | | | | | 0.280 | 0.280 | |
| | B | CO05-MB | | | | | | 0.280 | |
| | C | zinc octylate | | | | | | | 0.390 |
| | D | dicyandiamide | | | | | | | |
| | E | 2PHZ | | | | | | | |
| | F | tetraphenyl phosphonium tetraphenyl borate | | | | | | | |
| Coupling agent | | epoxy silane | | 0.325 | 0.350 | 0.360 | 0.360 | 0.360 | 0.305 |
| | | Impregnation | | ○ | ○ | ○ | ○ | ○ | ○ |
| | | Solder heat resistance | | ○ | ○ | ○ | ○ | ○ | ○ |
| | | Tackiness | | ○ | ○ | ○ | ○ | ○ | ○ |
| | | Processability for ENEPIG | | ○ | ○ | ○ | ○ | ○ | ○ |
| | | Flame resistance | | V-0 | V-0 | V-0 | V-0 | V-0 | V-0 |

TABLE 2

| | | | | Example 7 | Example 8 | Example 9 | Comparative example 1 | Comparative example 2 | Comparative example 3 |
|---|---|---|---|---|---|---|---|---|---|
| Epoxy resin | A | (solid) | NC3000 | | | | 8.400 | | |
| | B | | EXA7320 | | 13.860 | 13.860 | | 13.860 | |
| | C | | N665EXPS | 17.820 | | | | | |
| | D | (semisolid) | HP4032D | | | | | | |
| | E | (liquid) | ZX1059 | | | | | | 29.700 |
| Cyanate resin | A | PT30 | | | 13.860 | 13.860 | 15.000 | 13.860 | |
| | B | SN485 derivative | | | | | | | |
| Phenol resin | A | MEH7851 | | | | | 6.600 | | |
| | B | PR51470 | | 11.880 | | | | | |
| Maleimide resin | | BMI70 | | | | | | | |
| Silicanano particle | | | nanosilica | | 9.950 | 6.965 | 6.965 | | 9.950 |
| Particle | A | silica | SO25R | 29.850 | | | | | |
| | B | silica | SO32R | | 64.675 | 64.675 | 69.650 | 71.640 | 59.700 |
| | C | silicone composite powder | KMP600 | | | | | | |
| | D | aluminium hydroxide | BE033 | 19.900 | | | | | |
| | E | talc | LMS200 | 9.950 | | | | | |
| Curing catalyst | A | 2P4MHZ | | | | | | | |
| | B | CO05-MB | | | | | | 0.280 | |
| | C | zinc octylate | | | | | | | |
| | D | dicyandiamide | | 0.300 | | | | | |
| | E | 2PHZ | | | | | | | 0.300 |
| | F | tetraphenyl phosphonium tetraphenyl borate | | | 0.280 | 0.280 | | | |
| Coupling agent | | epoxy silane | | 0.350 | 0.360 | 0.360 | 0.350 | 0.360 | 0.350 |
| | | Impregnation | | ○ | ○ | ○ | Δ | x | ○ |
| | | Solder heat resistance | | ○ | ○ | ○ | x | x | x |
| | | Tackiness | | ○ | ○ | ○ | ○ | ○ | x |
| | | Processability for ENEPIG | | ○ | ○ | ○ | x | x | Δ |
| | | Flame resistance | | V-0 | V-0 | V-0 | NA | NA | nonstandard |

From the evaluation results shown in Tables 1 and 2, the following can be understood.

In Comparative examples 1 and 2, while the tackiness was good, the prepreg impregnation, solder heat resistance, processability for ENEPIG, and flame resistance were not at practical level since the silica nanoparticle specified in the present invention was not used.

In Comparative example 3, while the impregnation of the resin composition into the base material was good, the solder heat resistance, tackiness, processability for ENEPIG, and flame resistance were not at practical level since the epoxy resin composition as specified in the present invention was not used.

The prepreg, printed wiring board, and semiconductor device of the present invention obtained in each of Examples 1 to 9 were excellent in all of impregnation, solder heat resistance, tackiness, processability for ENEPIG, and flame resistance. Hence, it can be understood that by using the epoxy resin composition as specified in the present invention comprising the solid epoxy resin, the silica nanoparticle, and the silica particle, a prepreg, metal-clad laminate, printed wiring board, and semiconductor device excellent in performances can be obtained.

What is claimed is:

1. An epoxy resin composition comprising a solid epoxy resin, silica, and at least one of a cyanate resin and a maleimide resin,
the silica consisting of a silica nanoparticle having an average particle diameter of 1 nm or more and 100 nm or less, and a silica particle having an average particle diameter larger than that of the silica nanoparticle, in the range of 0.1 μm or more and 5.0 μm or less,
wherein an amount of the silica nanoparticle is from 5 to 20 weight % with respect to a total amount of the epoxy resin composition, and an amount of the silica particle is from 30 to 80 weight % with respect to the total content of the epoxy resin composition.

2. The epoxy resin composition according to claim 1, wherein the average particle diameter of the silica nanoparticle is 40 nm or more and 100 nm or less.

3. The epoxy resin composition according to claim 1, wherein the solid epoxy resin is at least one kind selected from the group consisting of a biphenylaralkyl type epoxy resin, and a naphthalene-skeleton-modified cresol novolac type epoxy resin.

4. The epoxy resin composition according to claim 1, wherein the silica particle has an average particle diameter of 0.1 μm or more and 1.5 μm or less.

5. The epoxy resin composition according to claim 1, wherein the silica particle has an average particle diameter of 1.1 μm or more and 1.5 μm or less.

6. A prepreg comprising a base material impregnated with an epoxy resin composition defined by claim 1.

7. A metal-clad laminate produced by a process comprising: providing the prepreg defined by claim 6 or a laminate of a plurality of the prepregs; laminating a metal foil on at least one surface of the prepreg or the laminate; and hot pressing the prepreg or the laminate, and the metal foil.

8. A printed wiring board comprising an insulating layer on an inner layer circuit, wherein the insulating layer is formed from a prepreg defined by claim 6.

9. A metal-clad laminate comprising a resin-impregnated base layer being a base material impregnated with an epoxy resin composition defined by claim 1, and a metal foil provided on at least one surface of the resin-impregnated base layer.

10. A printed wiring board comprising an inner layer circuit board formed from a metal-clad laminate defined by claim 9.

11. A semiconductor device comprising a printed wiring board defined by claim 10, and a semiconductor element provided on the printed wiring board.

12. A printed wiring board comprising an insulating layer on an inner layer circuit, wherein the insulating layer is formed from an epoxy resin composition defined by claim 1.

* * * * *